United States Patent [19]

Frieser et al.

[11] 4,312,012
[45] Jan. 19, 1982

[54] NUCLEATE BOILING SURFACE FOR INCREASING THE HEAT TRANSFER FROM A SILICON DEVICE TO A LIQUID COOLANT

[75] Inventors: Rudolf G. Frieser, Poughkeepsie; Morton D. Reeber, Shrub Oak, both of N.Y.

[73] Assignee: International Business Machines Corp., Armonk, N.Y.

[21] Appl. No.: 83,039

[22] Filed: Oct. 9, 1979

Related U.S. Application Data

[63] Continuation of Ser. No. 854,956, Nov. 25, 1977.

[51] Int. Cl.³ ............... H01L 25/04; H01L 23/02
[52] U.S. Cl. ..................... 357/82; 165/80 C; 174/16 HS; 357/81
[58] Field of Search ............ 357/81, 82; 174/16 HS; 165/80, 105

[56] References Cited

U.S. PATENT DOCUMENTS

| | | | |
|---|---|---|---|
| 3,741,292 | 6/1973 | Akalu et al. | 357/82 |
| 4,050,507 | 9/1977 | Chu et al. | 357/82 |
| 4,053,942 | 10/1977 | Dougherty et al. | 357/82 |
| 4,156,458 | 5/1979 | Chu et al. | 357/82 |

OTHER PUBLICATIONS

*IBM Technical Disclosure Bulletin*; vol. 19, No. 8, Jan. 1977; pp. 3125-3126.

*Primary Examiner*—Andrew J. James
*Attorney, Agent, or Firm*—Wolmar J. Stoffel

[57] ABSTRACT

The invention is a structure for improving the cooling characteristics of a silicon semiconductor device immersed in a fluid coolant. The cooling improvement is achieved by enhancing the nucleate boiling characteristics of the silicon device by initially forming lattice defects on the backside surface of the device by sandblasting and subsequently etching the damaged surface to remove the lattice defects and thereby produce an intricate surface morphology which provides nucleate boiling sites.

1 Claim, 8 Drawing Figures

HEAT TRANSFER OF SILICON TO C₆F₁₄

SILICON SURFACE ETCHED

SANDBLASTED SILICON SURFACE

SILICON SURFACE SANDBLASTED
FOLLOWED BY ETCH

NUCLEATE BOILING SURFACE FOR INCREASING THE HEAT TRANSFER FROM A SILICON DEVICE TO A LIQUID COOLANT

This is a continuation of application Ser. No. 854,956 filed 11/25/77.

BACKGROUND OF THE INVENTION

This invention relates in general to an apparatus for increasing the rate of heat transfer between a heated surface and a liquid coolant, and finds particular utility in cooling of semiconductor elements and circuits. Additionally, the invention relates to a housing or support for semiconductor elements and circuits having surfaces which are particularly adapted to increase the rate of heat transfer between the surfaces and the liquid coolant in contact therewith.

In modern high density semiconductor packaging technology it is necessary to transfer heat from the surface of a heated semiconductor element to a heat sink at a rate sufficiently high to limit the unavoidable increase in the temperature of the semiconductor material. One such technique for transferring heat is to immerse the semiconductor devices in a liquid coolant which is enclosed by a suitable chamber usually provided with suitable cooling fins. In operation the heat generated in the semiconductor devices causes the liquid coolant to boil at the surface of the chip. The heat generated by the semiconductor is transferred to the liquid coolant when the liquid is vaporized. A portion of the heat is absorbed as the latent heat of vaporization of the liquid, the remainder being absorbed by the convection of the liquid at the chip surface. The motion of the vapor bubbles leaving the surface of the chip breaks up the stagnant boundary layer of fluid at the chip surface, greatly enhancing the convective heat flow. The vapor is subsequently condensed on the relatively cold finned sidewall of the chamber containing the liquid. Typical integrated circuit packages of this type are illustrated and disclosed in U.S. Pat. No. 3,741,292 and U.S. Pat. No. 3,851,221.

A significant problem is encountered in liquid cooled semiconductor packages in promoting nucleate boiling. The liquid coolant must be very pure since it comes into contact with the metallurgy on the substrate supporting the devices and also the device contacts. Any foreign material contained in the liquid coolant may cause contamination problems in the package. This requirement precludes the presence of material in the liquid which might otherwise serve as centers to promote nucleate boiling. Also the semiconductor devices mounted in the package do not ordinarily have the type of surface exposed to the liquid which will promote nucleate boiling. The silicon surface is normally highly polished and therefore devoid of centers which would promote nucleate boiling. Still further the cooling fluids normally used in such packages, typically fluorocarbons, wet the silicon and therefore inhibit any imperfections from becoming nucleate boiling centers which might otherwise function as such in other fluids. Various techniques have been suggested for forming nucleate boiling centers on the silicon devices such as sand blasting or etching, as suggested in IBM Technical Disclosure Bulletin Vol. 19, No. 3, Aug. 1976, Page 937. However, such techniques have not been satisfactory for a Si-fluorocarbon system since an insufficient number of nucleate boiling centers are formed. Another approach has been suggested, namely, to provide a heater consisting of a high resistance wire connected to a suitable source of current which will initiate and maintain a boiling action. However, this approach is also not satisfactory since (1) additional heat is being introduced into the package which is undesirable; and (2) the boiling should preferably occur on a surface on the semiconductor device. While the aforementioned heater element will prevent flash boiling and destruction of the package, as when the coolant becomes highly super heated, it does not provide the type of cooling necessary in a high density semiconductor package.

SUMMARY OF THE INVENTION

An object of this invention is to provide a new technique for producing a thermally active silicon surface for transferring heat to a boiling liquid by providing a suitably large number of nucleate boiling centers.

Another object of this invention is to provide a new and novel silicon integrated circuit semiconductor device provided with a surface that enhances nucleate boiling at the heat generating elements, i.e., the devices.

Yet another object of this invention is to provide a new semiconductor package for integrated circuit semiconductor devices wherein a surface on the semiconductor device is provided which enhances nucleate boiling of the fluid.

In accordance with the aforementioned object the invention is a semiconductor package structure combination which includes a substrate support, at least one integrated circuit device mounted on the substrate, flip-chip bonding means interconnecting the chip with a metallurgy system on the substrate, the improvement comprising a surface on the integrated circuit device that enhances nucleate boiling of the cooling fluid, the surface formed by initially sand blasting the silicon surface of the device and subsequently etching in an etchant for silicon.

DESCRIPTION OF PREFERRED EMBODIMENTS

Figure 1:
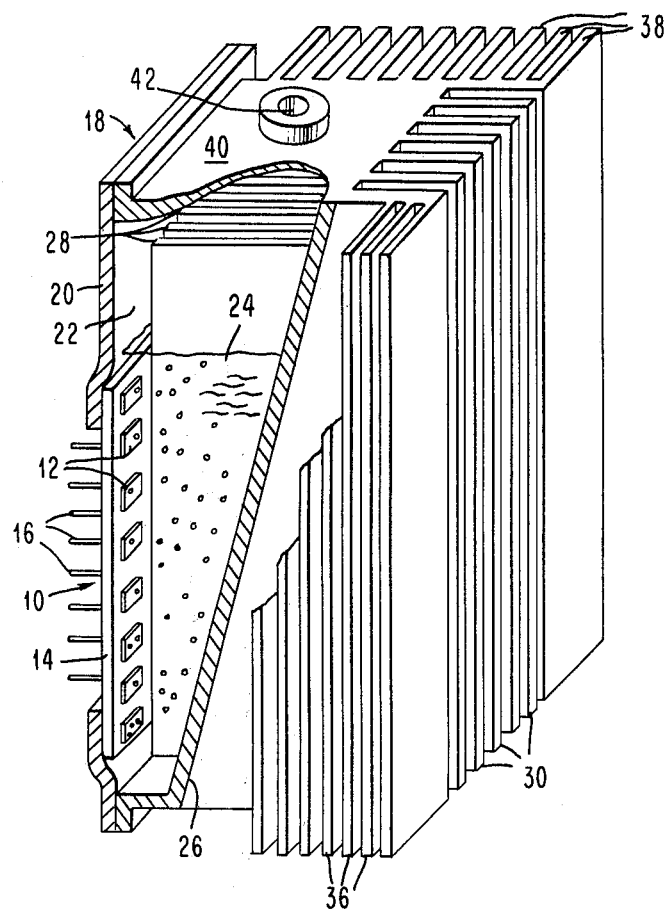
FIG. 1 is a perspective view in broken section illustrating a typical liquid cooled semiconductor package in which the invention can be employed.

Referring now to FIG. 1 of the drawing there is depicted a typical liquid cooled electronic module 10 in which the nucleate boiling surface on a silicon chip mounted therein can be utilized. It is to be understood that the package structure of FIG. 1 is shown for purposes of illustration and it is not intended to limit the invention to the specific structure shown. Module 10 has a number of chips 12 located on a substrate 14. The chips 12 each contain a number of electronic circuits and are located along one surface of the substrate 14. Pins 16 extend from the substrate 14 for connecting or plugging the module 10 into place on a board or other support. Chips 12 are arranged in columns on substrate 14 although the arrangement is not limited to such a configuration. A container or can 18 is attached to the substrate 14 of the module 10 in sealed relationship. Actually the module 10 forms a part of one of the walls of container 18. A flange 20 extends upward from the substrate 14 to the top of the container. The length of the flange 20 determines the height of the vapor space 22 above the top of module substrate 14.

Container 18 is partially filled with a low boiling point dielectric liquid 24 such as one of the fluorocarbons, for example, FC78 or FC88. The container 18 is filled to a height slightly above the chips 12. The area above the liquid level forms a vapor space 22. The wall 26 opposite the wall containing the module 10 preferably slopes outwardly from the bottom to the top. Thus the container 18 is a very narrow cross sectional area at the bottom and a much wider cross sectional area at the top. A plurality of fins 28 extend from the sloped backwall 26 into the container 18. These fins 28 extend into the container 18 substantially filling the container. The fins 28 are parallel to one another and extend vertically within the container. Accordingly the finned surface area in the vapor space 22, that is the space above the liquid level, is much larger because of the slope of the backwall 26. It can be seen that the surface area of the internal fins 28 diminishes as the fins extend downward into the container, again because of the slope of the wall 26. External fins 30 extend from the opposite side of the sloped wall 26. Fins 36 and 38 are provided on the sidewalls of chamber 18 to conduct heat away from the chamber. A liquid filling port 42 is provided on the top of the chamber 18.

In operation the heat generated by the electronic chips 12 causes boiling of the coolant 24, the bubbles of which rise in the dielectric liquid. The vapor from the boiling bubbles rises in the liquid and emerge in vapor space 22 where it condenses on the cooler internal fins 28. The heat is carried by the fins 28 through the wall 26 and to the external fins 30 of the container. It will be appreciated that the surface area of the internal fins 28 exposed to the vapor space 22 is quite large thus giving considerable area for the condensation of vapors.

The aforementioned package operates very well to dissipate the heat generated in operation by chips 12 provided that the boiling of the liquid can be efficiently initiated. However, the initiation of nucleate boiling at the chip surfaces, which are the hottest surfaces in the system, is not always dependable because of (1) the necessary cleanliness of the cooling fluid, (2) the usual polished surface of the backside of the chip and (3) the fluids of choice for electronic systems wet the silicon surface very well. The initiation of boiling on a heated solid surface submerged in a fluid occurs at discrete locations called nucleation sites. These sites are local irregularities that are not filled by the fluid, leaving a small vapor-liquid interface. Heat supplied by the solid can go directly into vaporization of the fluid, leading to a growing bubble at that location. In the absence of the established interface, there must be sufficient energy available to establish the boundary before bubble growth can occur. This requires a large local fluctuation in energy, or a rise in temperature. When a surface is well wetted by a fluid, as in the case with a fluorocarbon fluid and a silicon surface, these local surface irregularities are completely filled by the fluid and no nucleation occurs without considerable excess temperature. It is theorized that nucleation sites can be guaranteed if a surface is generated so complex that the fluid cannot completely fill the interstices.

Figure 2:
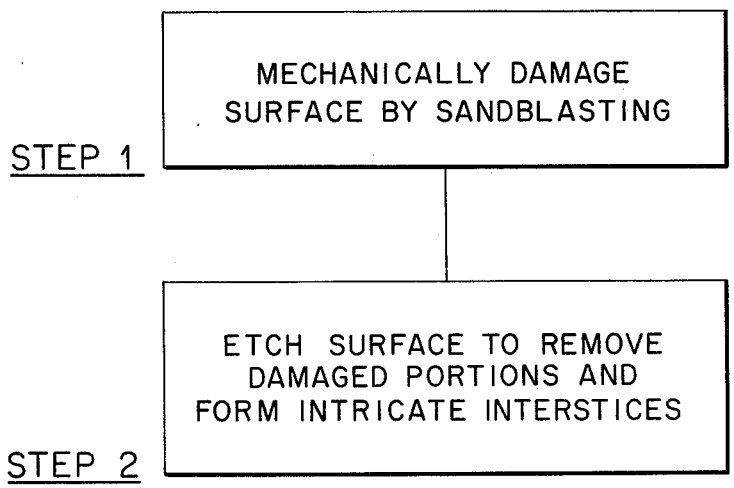
FIG. 2 is a flow diagram setting forth the method steps of an embodiment of the invention.
Figure 5A:
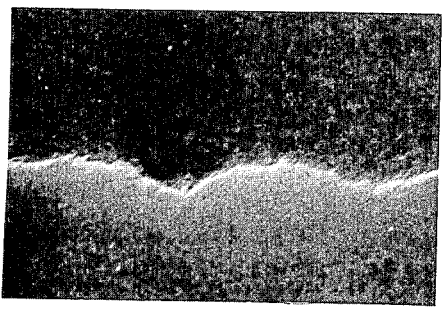
FIG. 5A and 5B are micrographs of a polished angle section and a top view of a silicon surface respectively, that has been sand blasted.
Figure 5B:
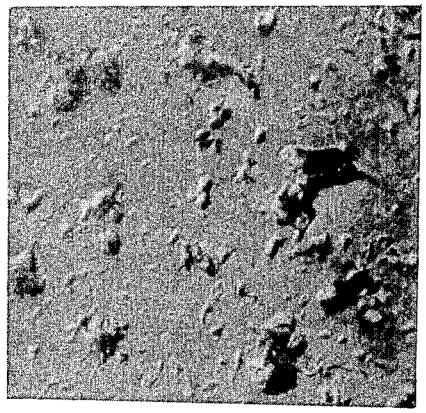

Referring now to FIG. 2 of the drawing there is depicted the general method steps for producing a surface having superior nucleate boiling characteristics. Step 1 involves mechanically damaging the surface of the silicon chip to produce small lattice defects. These defects can be produced by sand blasting the backside of a silicon chip or device. A preferred embodiment is sand blasting with a "Vapor Blaster" which is produced by Pressure Blast Manufacturing Company, for one to two minutes at 75 pounds total pressure. A preferred abrasive is a water slurry of 400 mesh alumina or silica. The wafers prior to their being sectioned into devices can be either held by hand without a support or glued with glycol phthalate to either a plastic or glass disk. Two minutes at most is sufficient time to produce the uniform dullness over all the wafer surface. The sand blasted wafer is then washed in running DI water and dried in a stream of nitrogen. The resultant surface roughness following the sand blasting operation is indicated in FIG. 5A and 5B. FIG. 5A is a polished 1.5X angle section at a magnification of 2500X. FIG. 5B is a top view interference contrast microphotograph at a magnification of 1600X. Note that although the surface is roughened, the sand blasting operation alone did not produce intricate interstices in the device.

Figure 6A:
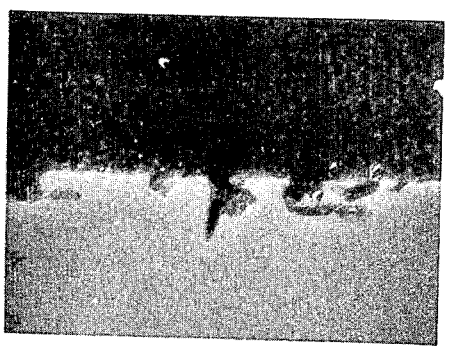
FIG. 6A and 6B are micrographs taken of an angle section and a top view, respectively of a silicon surface that has been produced in accordance with the method of the invention.
Figure 6B:
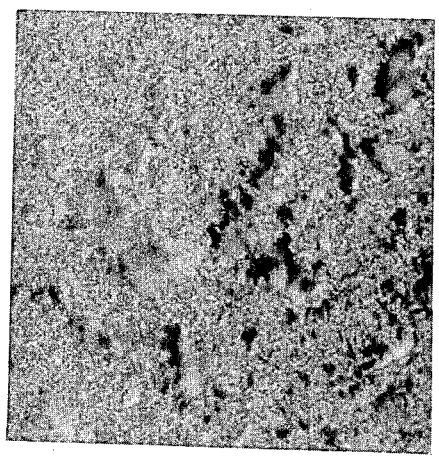

The second step in the process of the invention is to etch the surface of the sand blasted wafer to remove the damaged portions and thereby form intricate interstices which will act as nucleate boiling centers. Any suitable silicon etch can be used to remove the damaged portions of the silicon wafer produced by the sand blasting operation. A preferred silicon etch is a pyrocatechol-amine-water system composed of 16 milliliters of D.I. water plus 34 milliliters of ethylene-diamine plus 6 grams of pyrocatechol. Another preferred silicon etch is an aqueous potassium hydroxide solution, more specifically ¼ 5 N KOH, ¾ water solution. The etching operation can be done at any suitable temperature preferably from 50° to 80° C. The etch time is on the order of one to two minutes. Etching the silicon surface in which lattice defects have been introduced by sand blasting produced a very complex surface as indicated in FIG. 6A and 6B. FIG. 6A is a polished 1.5X angle section at a magnification of 2220X. FIG. 6B is a top view interference contrast microphotograph having a magnification of 1600X. Note that the surface is very irregular and now has intricate interstices which have been proven to act as effective nucleate boiling centers. The effectiveness of the combustion of etching plus sand blasting, as compared to sand blasting alone, for producing intricate interstices can be evaluated by comparing FIG. 5A and 5B with FIG. 6A and 6B. Xray topographs indicate that the sand blasting operation described in step 1 introduces a large amount of stress in the wafer. After the etching operation is completed the stresses are in large part relieved.

The following examples are disclosed and represent preferred embodiments of the invention and are not intended to severly limit the scope of the claims.

EXAMPLE 1

Figure 3:
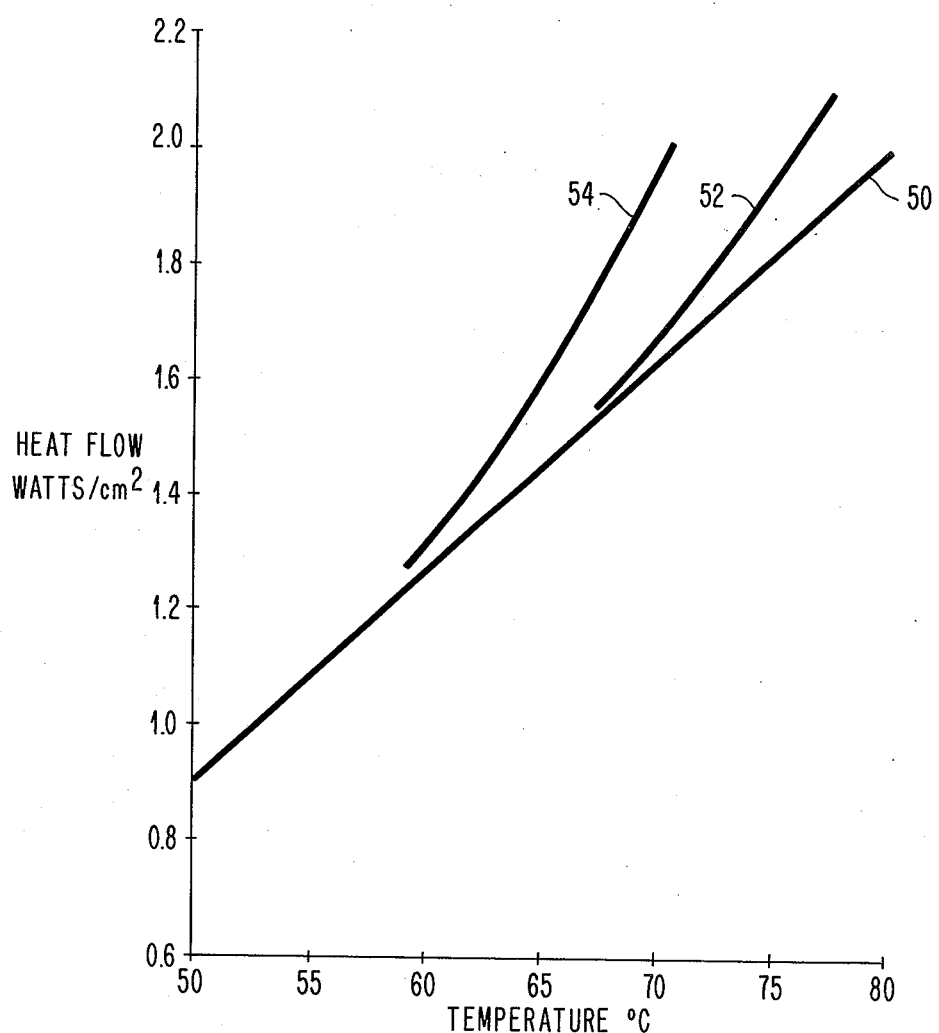
FIG. 3 is a graph of heat flow in watts per $cm^2$ versus temperature of the device. The gathering of data for the graph is described in the examples which provides comparison of the operating characteristics of the nucleating surface produced by the method of the invention with conventional methods.

The thermal behavior of a polished silicon surface was examined. A first polished wafer was mounted on a phenolic holder in which there was embedded a heat source in close proximity to the back side of the wafer and also a thermocouple. The heat source was a solid copper spool 25 mm in diameter, and 6 mm thick, with a winding made of 40 gauge CU- Ni wire. The thermocouple was located in the center of the copper spool. The wafer with a diameter of 60 mm was arranged so that the exposed face was substantially flush with the holder and in contact on the back side to the heat source. The assembly was then mounted in a cell filled with perfluorohexane to a depth of 1.7 centimeters above the top of the mounted wafer. Included also was a mercury thermometer permanently located at the same depth as the center of the wafer to measure the fluid temperature, and a reflux condenser mounted in the sealing cap of the container to prevent fluid losses. All measurements were taken during the test in a quasi-static state, after the power was maintained constant for at least 30 minutes. Quantities measured included heat source temperature, the heat source power, the elapsed time, and the background fluid temperature. Before taking any data the surface of the wafer was degassed by boiling for 12 hours and cooled for 4 hours to room temperature. Various power inputs were made to the heat source and the temperature of the wafer was measured after the system had attained a steady state. This data so taken was then plotted which appears as curve 50 in FIG. 3. Note that the curve 50 is substantially straight over the entire temperature range which indicated that the heat was transferred from the polished and untreated wafer to the liquid primarily by conduction.

EXAMPLE 2

Figure 4:
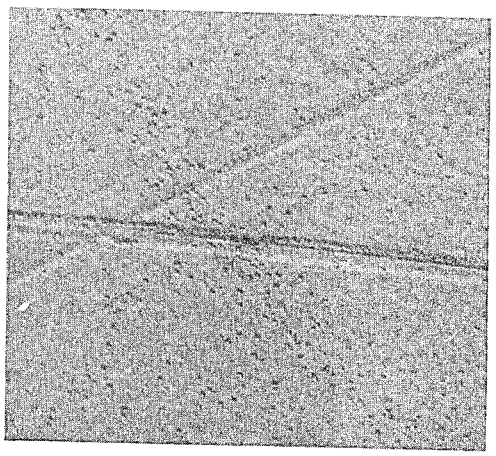
FIG. 4 is a micrograph of a silicon surface etched with an etchant for silicon.

The surface of a second silicon wafer was etched for 1 minute in a potassium hydroxide etch consisting of a 5 N solution of KOH in water diluted with approximately 3 parts water to 1 part KOH solution. The temperature at which the etching operation took place was 50° C. Following the etching operation the surface was examined and found to contained many four sided pyramidal pits. The nature of the resultant etched surface is indicated in FIG. 4 which is an interference contrast microphotograph with a magnification of 1600X. The wafer was then placed on the holder described in Example 1 and the same measurements made. The data obtained was plotted on FIG. 3 and the resultant curve was found to coincide with curve 50. Thus it indicates that no significant improvement in nucleate boiling is obtained by etching a polished silicon surface.

EXAMPLE 3

A third silicon wafer was sand blasted as described in step 1 and was then placed on the phenolic holder described in Example 1. The same type of experimental procedure was made to evaluate the nucleate boiling characteristics. The resultant data was plotted on FIG. 3 and appears as curve 52. This curve indicates that some improvement in the nuclete boiling characteristics of a silicon surface is obtained by sand blasting the surface as compared to a polished silicon surface or a polished and etched silicon surface.

EXAMPLE 4

A fourth silicon wafer was selected and subjected to a sand blast operation for 1 minute. This was done in a "Vapor Blaster" using a standard multiperforated nozzle at approximately 6 to 8 inches from the substrate at 75 pounds total pressure. The abrasive was a water slurry of 400 mesh alumina. After two minutes of sand blasting a uniform dullness was produced over the entire surface of the wafer. The wafer was then washed in running D.I. water and dried in a stream of nitrogen. Subsequently the wafer was etched in a potassium hydroxide etchant which consisted of a 5N solution of KOH in water diluted with 3 parts water to 1 part solution. The substrate was exposed to the etchant for approximately 1½ minutes at 80° C. The resultant sand blasted etched wafer was then placed on the phenolic support and its boiling characteristics determined as described in Example 1. The data was then plotted on FIG. 3 which appears as curve 54. As curve 54 indicates a pronounced improvement is obtained by using the combination of sand blasting and etching. The improvement is clearly more than the additive effects of etching and sand blasting as indicated by the curves 50 and 52.

What is claimed is:

1. In a silicon integrated circuit device adapted for immersion in a fluorocarbon liquid coolant in a semiconductor package, the improvement comprising an intricate surface morphology on the back side surface of said device that in use provides enhanced nucleate boiling characteristics, said surface characterized as porous and sponge-like, said surface embodying very small interconnected irregular shaped cavities that have a depth greater than the diameter and are of a shape and size to preclude wetting of the interior surfaces by said fluorocarbon liquid coolant, said surface morphology formed in monocrystalline silicon that is substantially free of crystalline lattice damage.

* * * * *